(12) United States Patent
Touba et al.

(10) Patent No.: US 8,335,954 B2
(45) Date of Patent: Dec. 18, 2012

(54) METHOD AND APPARATUS FOR LOW-PIN-COUNT SCAN COMPRESSION

(75) Inventors: Nur A. Touba, Austin, TX (US); Laung-Terng Wang, Sunnyvale, CA (US); Shianling Wu, Princeton Junction, NJ (US)

(73) Assignee: Syntest Technologies, Inc., Sunnyvale, CA (US)

( * ) Notice: Subject to any disclaimer, the term of this patent is extended or adjusted under 35 U.S.C. 154(b) by 0 days.

(21) Appl. No.: 13/529,686

(22) Filed: Jun. 21, 2012

(65) Prior Publication Data

US 2012/0266036 A1    Oct. 18, 2012

Related U.S. Application Data

(60) Division of application No. 13/172,046, filed on Jun. 29, 2011, now Pat. No. 8,230,282, which is a continuation of application No. 12/546,060, filed on Aug. 24, 2009, now Pat. No. 7,996,741.

(51) Int. Cl.
*G01R 31/28* (2006.01)
(52) U.S. Cl. .......................... 714/736; 714/731; 714/726
(58) Field of Classification Search .................. 714/724, 714/726, 727, 729, 731, 733, 736, 741
See application file for complete search history.

(56) References Cited

U.S. PATENT DOCUMENTS

| | | | |
|---|---|---|---|
| 6,286,121 B1* | 9/2001 | Osawa et al. ................. | 714/738 |
| 6,684,358 B1* | 1/2004 | Rajski et al. .................. | 714/739 |
| 7,380,187 B2* | 5/2008 | Dubey .......................... | 714/727 |
| 7,512,851 B2* | 3/2009 | Wang et al. ................... | 714/726 |
| 2003/0131298 A1* | 7/2003 | Rajski et al. .................. | 714/738 |
| 2006/0064614 A1* | 3/2006 | Abdel-Hafez et al. ........ | 714/726 |

OTHER PUBLICATIONS

Yinhe Han; Xiaowei Li; Swaminathan, S.; Yu Hu; Chandra, A.;, "Scan Data Volume Reduction Using Periodically Alterable MUXs Decompressor," Test Symposium, 2005. Proceedings. 14th Asian, vol., no., pp. 372-377, Dec. 18-21, 2005.*
Krishna, C.V.; Touba, N.A.;, "Adjustable width linear combinational scan vector decompression," Computer Aided Design, 2003. ICCAD-2003. International Conference on, vol., no., pp. 863-866, Nov. 9-13, 2003.*
A. Durra and N.A. Touba, "Using Limited Dependence Sequential Expansion for Decompressing Test Vectors," Proc. IEEE International Test Conference, paper 23.1, 2006.*

\* cited by examiner

*Primary Examiner* — Cynthia Britt
(74) *Attorney, Agent, or Firm* — Bacon & Thomas, PLLC

(57) ABSTRACT

A low-pin-count scan compression method and apparatus for reducing test data volume and test application time in a scan-based integrated circuit. The scan-based integrated circuit contains one or more scan chains, each scan chain comprising one or more scan cells coupled in series. The method and apparatus includes a programmable pipelined decompressor comprising one or more shift registers, a combinational logic network, and an optional scan connector. The programmable pipelined decompressor decompresses a compressed scan pattern on its compressed scan inputs and drives the generated decompressed scan pattern at the output of the programmable pipelined decompressor to the scan data inputs of the scan-based integrated circuit. Any input constraints imposed by said_combinational logic network are incorporated into an automatic test pattern generation (ATPG) program for generating the compressed scan pattern for one or more selected faults in one-step.

10 Claims, 19 Drawing Sheets

METHOD AND APPARATUS FOR LOW-PIN-COUNT SCAN COMPRESSION

This application is a divisional of allowed U.S. patent application Ser. No. 13/172,046, filed Jun. 29, 2011, which is a continuation of U.S. patent application Ser. No. 12/546,060, filed Aug. 24, 2009, now U.S. Pat. No. 7,996,741.

FIELD OF THE INVENTION

The present invention generally relates to the field of logic design and test using design-for-test (DFT) techniques. Specifically, the present invention relates to the field of logic test and diagnosis for integrated circuits using scan compression techniques.

BACKGROUND

Different scan compression techniques have emerged for compressing scan patterns, generated using automatic test pattern generation (ATPG) tools, for reducing both test application time and test data volume for a scan core in a scan-based integrated circuit. Current scan compression techniques rely on inserting a decompressor between a limited number of compressed scan inputs and a large number of internal scan chains. The decompressor can be designed as a combinational circuit that generates decompressed scan patterns for the internal scan chains depending on the compressed scan patterns applied to the compressed scan inputs, or as a sequential circuit that can be used to generate the decompressed scan patterns for the internal scan chains based on previously stored states of the sequential elements.

Scan compression techniques utilizing a combinational decompressor typically consist of an exclusive-OR (XOR) or multiplexor (MUX) tree that may be controlled by additional control inputs or controlled by an internally stored state. See the patent by Koenemann et al. (2003) and the patent by Wang et al. (6/2009). Alternatively, a pipelined decompressor that places one or more pipelined shift registers in front of the XOR or MUX tree is used to further increase the encoding flexibility of the combinational decompressor and thus allows using only very few input pins, as low as one compressed scan input, for scan decompression. See the allowed patent by Abdel-Hafez et al. (2006/0064614), the papers co-authored by Dutta and Touba (2006), and by Chandra et al. (2009), and the patent application by Wang et al. (Ser. No. 11/889,710).

Scan compression techniques utilizing a sequential decompressor typically embed a linear-feedback shift register (LFSR) between the compressed scan inputs and internal scan chains and use the compressed scan inputs to control the LFSR in a way that makes it generate the required decompressed scan patterns, while utilizing 'don't care' states present in the decompressed scan patterns to reduce the complexity of the problem. See the patent by Rajski et al. (2001).

In general, scan compression techniques utilizing a sequential decompressor such as an LFSR circuit is difficult to use, requiring additional software to solve the linear equations involved in order to translate the decompressed scan patterns into the external compressed scan patterns that can be used to generate the required decompressed scan patterns through the LFSR. This results in a two-step test generation process. In some cases, these linear equations can turn out to be unsolvable, requiring multiple iterative runs where the decompressed scan patterns are reordered, duplicated, or regenerated in order to be able to generate compressed scan patterns which covers all the required faults. This can result in a significant computational overhead. In general, the compression capability of these techniques is limited since it requires that the decompressed scan patterns be generated loosely in order to guarantee that the compression equations can be solved. This results in compressing decompressed scan patterns that are sub-optimal, as opposed to compressing tightly packed decompressed scan patterns where both static and dynamic compaction are performed aggressively. Finally, any changes made to the circuit after generating the decompressed scan patterns require abandoning these patterns and going back to the beginning of the iterative process. This makes these techniques much less attractive than techniques utilizing a combinational decompressor, built mainly out of XOR or MUX gates which can utilize a one-step test generation process to automatically generate patterns that are encodable.

Current techniques utilizing a combinational decompressor or a pipelined decompressor utilize different combinational circuit designs for generating the decompressed scan patterns. In some techniques, the decompressed scan patterns are generated such that the decompressed scan patterns for each internal scan chain depends on multiple compressed scan inputs. In other techniques, the decompressed scan patterns for each internal scan chain depends on only one compressed scan input, with a few additional control inputs used to alter the relationship for different scan patterns. Finally, in some techniques, sequential elements are used in place of the additional control inputs to alter the relationship for different scan patterns. These sequential elements are typically preloaded with different data for each scan pattern. The advantage of these techniques is that the relationship between the decompressed scan patterns and the compressed scan patterns is easy to define and understand, and can be easily incorporated into the ATPG tools as part of the vector generation process, such that the compressed scan patterns are generated automatically, with dynamic compaction being aggressively applied.

The main difficulty with current decompression solutions utilizing a combinational decompressor is that the number of compressed scan inputs is typically greater than 3 to obtain an acceptable compression ratio, say 10 times, for reduction in test data volume and test application time. While a pipelined decompressor could use only one compressed scan input for scan compression, it is unclear what compression ratios in terms of test data volume and test application time one could achieve when the number of pipelined shift register stages in the pipelined decompresor is fixed.

Accordingly, there is a need to develop an improved method and apparatus for scan compression. The method in this invention is based on making the pipelined decompressor placed in front of the scan cells (scan flip-flops/latches) of the scan-based design programmable so a low-pin-count scan compression can be performed to achieve highest compression ratio.

SUMMARY OF THE INVENTION

Accordingly, in this invention, the difficulties that arise from using a combinational decompressor (or a pipelined decompressor) are solved by making the shift registers shown in FIG. 2 (or FIG. 3) programmable. The resulting programmable pipelined decompressor may comprise one or more programmable shift registers (PSRs), a combinational logic network, and an optional scan connector (see FIG. 4).

For example, in a first embodiment of the invention, a programmable shift register (PSR) may comprise one or more D flip-flops (or latches) and one or more multiplexers. The input of the programmable shift register may be connected to a compressed scan input (CSI) coming from an ATE; each output of the multiplexers and CSI may drive the combinational logic network (see FIG. 5). Alternatively, each output of the D flip-flops (or latches) and CSI may drive the combinational logic network (see FIG. 11).

The select pin of each multiplexer may connect to a control input, which may be either directly coming from a chip pad or taken from an output of a separate shift register under the IEEE 1149.1 test access port (TAP) control. The control input is set to a predetermined value to reconfigure the programmable shift register as a depth-d pipelined shift register, where d is a predetermined number (see FIGS. 6-10), to reduce test data volume and test application time.

In a second embodiment of the invention, the shift order of a programmable shift register may be in a forward, backward, or mixed forward-backward direction (see FIGS. 12-13). Changing the order of the shift register outputs that drive the combinational logic network may further provide higher encoding flexibility in detecting faults within the scan core. Alternatively, the control inputs may be used to invert or not invert the inputs and/or outputs of the combinational logic network.

In a third embodiment of the invention, the combinational logic network may comprise one or more combinational logic gates, selected from AND gates, OR gates, NAND gates, NOR gates, multiplexers, XOR gates, XNOR gates, buffers, inverters, or a combination of the above (see FIGS. 14-16).

In a fourth embodiment of the invention, the optional scan connector may include one or more buffers, inverters, lockup elements each comprising a storage element such as flip-flop or latch, spare scan cells, multiplexers, or any combination of the above (see FIG. 17). The scan connector may further selectively select outputs of the combinational logic network or selected scan outputs of all scan chains in the scan core for connection to selected scan inputs of all scan chains; wherein the scan connector may comprise a multiplexer network, and the multiplexer network may be controlled by one or more virtual scan inputs and be loaded with a predetermined state before a test session starts. A benefit of this scan connector is to use multiple ratios of internal scan chains to compressed scan inputs (i.e., expansion ratios) as described in Pandey and Patel (2002) and Putman and Touba (2007) to improve the compression ratios. The idea is to start with a higher expansion ratio than normal and then progressively reduce the expansion ratio to detect any faults that remain undetected. By detecting faults at the highest expansion ratio possible, the amount of compression can be significantly improved. The expansion ratio may be progressively reduced by concatenating scan chains together using multiplexers to make fewer and longer scan chains.

In a fifth embodiment of the invention, a synthesis flow diagram is developed to synthesize the programmable pipelined decompressor at a register-transfer level (RTL) or a gate-level. Also, a method for automatically generating a compressed scan pattern at the compressed scan inputs of a decompressor is developed to test the scan core for detecting a manufacturing fault in one-step. The manufacturing faults may include a stuck-at fault, a transition fault, a path-delay fault, an IDDQ (IDD quiescent current) fault, or a bridging fault, within the scan core.

The main advantage of this invention is that since the combinational decompressor or the pipelined decompressor is programmable, it is possible to perform scan compression with low-pin-count. A further advantage is that it allows us to achieve higher reductions in test data volume and test application time because one can test the scan core starting from a depth-0 pipelined shift register, depth-1 pipelined shift register, a depth-2 pipelined shift register, etc. Finally, scan cells that are needed to test faults that are hard to detect can be detected by reversing or reordering the outputs of the programmable shift register in a different direction.

Another advantage of this invention is that adding programmable shift registers which can comprise selected scan cells or spare flip-flops/latches in the combinational decompressor, provides greater encoding flexibility than purely combinational decompressors (XOR or MUX gates) while still retaining the ability to perform a one-step ATPG as described by Wang et al. (7,552,373), Wang et al. (Ser. No. 11/889,710), Dutta and Touba (2006), and Chandra et al. (2009). Conventional LFSR-based decompressors contain feedback which results in very complex input constraints thereby requiring a two-step test generation process that requires a linear equation solver to check if test cubes (test patterns with unspecified don't care values, X's) are encodable to generate compressed scan patterns. By using shift registers, which do not contain feedback, the invention described here is able to have simple constraints making it feasible to directly account for them in the test generation program so that a one-step ATPG can be performed.

THE BRIEF DESCRIPTIONS OF DRAWINGS

The above and other objects, advantages and features of the invention will become more apparent when considered with the following specification and accompanying drawings wherein.

DETAILED DESCRIPTION OF THE INVENTION

The following description is presently contemplated as the best mode of carrying out the present invention. This description is not to be taken in a limiting sense but is made merely for the purpose of describing the principles of the invention. The scope of the invention should be determined by referring to the appended claims.

Figure 1:
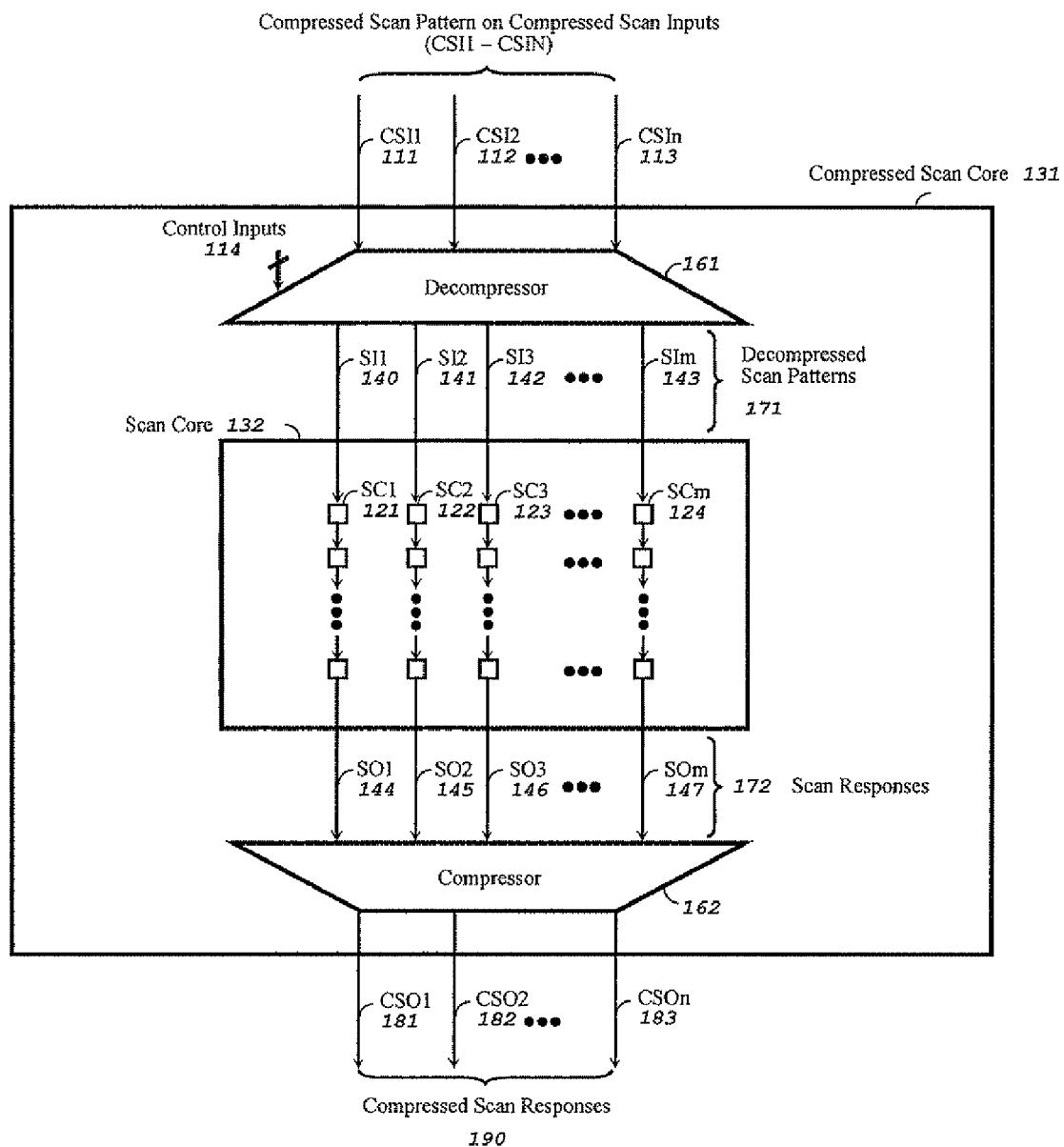
FIG. 1 shows a general block diagram of a compressed scan test system for testing a scan core in a scan-based integrated circuit with compressed scan patterns using an automatic test equipment (ATE)

FIG. 1 shows a general block diagram of a compressed scan test system for testing scan-based integrated circuits with compressed scan patterns using an ATE (automatic test equipment). The Compressed Scan Core 131 comprises a Scan Core 132 surrounded by a Decompressor 161 and Compressor 162. It further accepts a Scan-Test Mode 110 signal, and Compressed Scan patterns 101 applied on external compressed scan inputs CSI1 111 to CSIn 113 to drive the Decompressor 161. The Decompressor 161 also accepts Control Inputs 114 to control the Decompressor during scan-test. The Decompressor accepts the Compressed Scan patterns 101 and generates Decompressed Scan patterns 171 on the internal scan chain inputs SU 140 to SIm 143 to drive the scan chains SC1 121 to SCm 124 embedded in Scan Core 132. Scan chain outputs SO1 144 to SOm 147 are then used to drive Compressor 162 to compact the Scan Data Responses 172 into Compressed Scan Data Responses 190 driven out of the Compressed Scan Core 131 on external compressed scan outputs CSO1 181 to CSOn 183. In this prior-art compressed scan test system, the ATE generates and applies the Compressed Scan patterns 101 to the Compressed Scan Core 131, and accepts the Compressed Scan Data Responses 190 for comparison.

Figure 2:
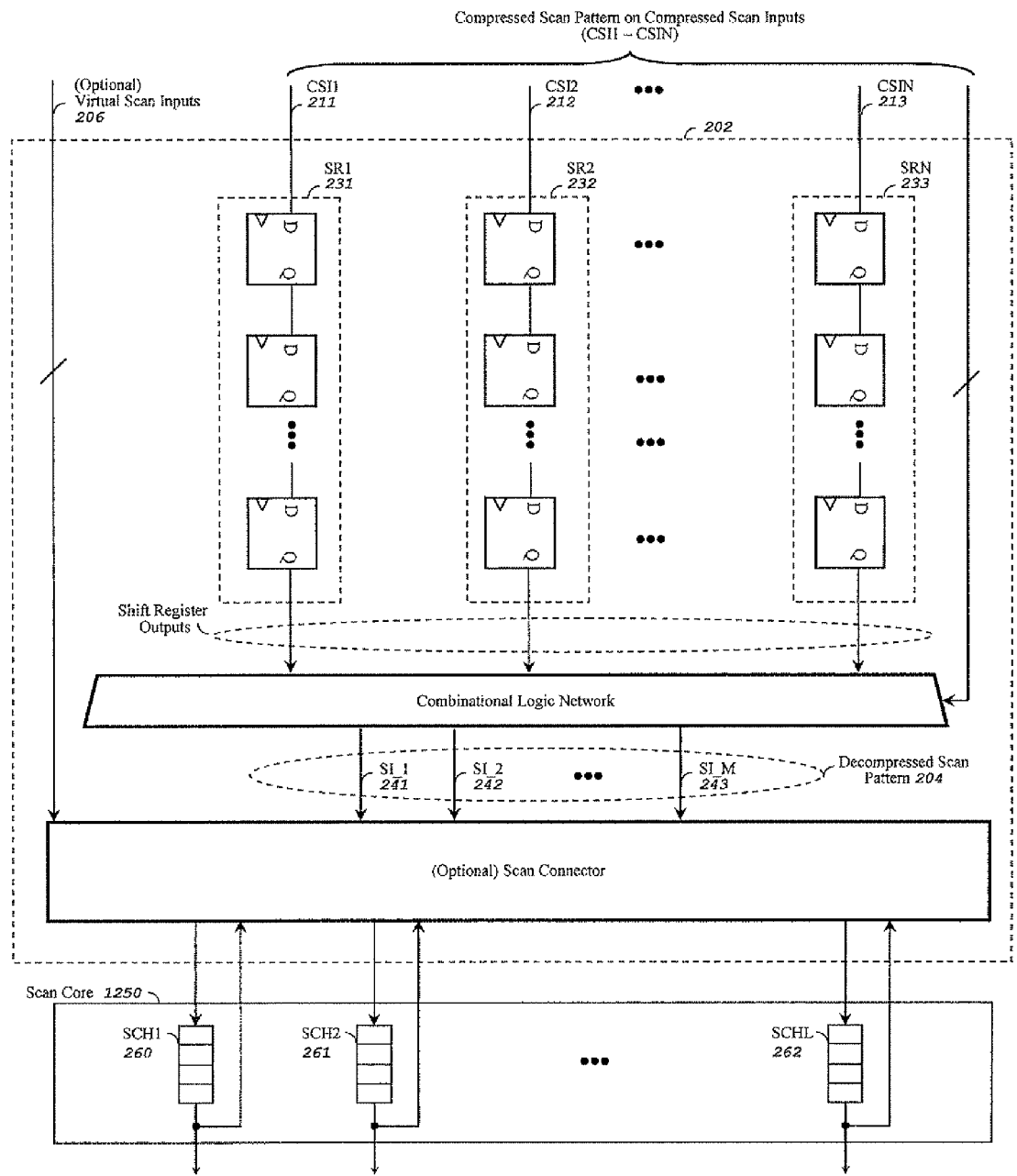
FIG. 2 shows a first prior art block diagram of a pipelined decompressor for testing a scan core.

FIG. 2 shows a prior art block diagram of a pipelined decompressor, consisting of multiple shift registers, a combinational logic network, and an optional scan connector. The pipelined decompressor 202 receives a compressed scan pattern 201 on its compressed scan inputs, CSI1 211 through CSIN 213, and generates a decompressed scan pattern 204 on its outputs, SI_1 241 through SI_M 243. The decompressed scan pattern 204 is to be loaded into the scan data inputs of the scan core 250 through the optional scan connector 205. The scan core 250 comprises one or more scan chains, SCH1 260 through SCHL 262, where each scan chain consists of multiple scan cells.

The multiple shift registers, SR1 231 through SRN 233, receive the compressed scan pattern 201 from their compressed scan inputs CSI1 211 through CSIN 213. In principle, the multiple shift registers can comprise selected scan cells in the scan core 250 or spare flip-flops or latches that are connected in series to form one or more pipelined shift registers and are placed between the compressed scan inputs and the combinational logic network. One unique property of the shift register is that there is no circular loop as in an LFSR.

The combinational logic network 203 receives its inputs from the compressed scan inputs, CSI1 211 through CSIN 213, and the flip-flops or latches in the shift registers, SR1 231 through SRN 233. The pipelined decompressor 202 generates the decompressed scan pattern 204 on its outputs, SI_1 241 through SI_M 243, which are used to load the test into the scan data inputs of the scan core 250. The combinational logic network 203 further comprises one or more combinational logic gates, selected from AND gates, OR gates, NAND gates, NOR gates, multiplexers, XOR gates, XNOR gates, buffers, inverters, or a combination of the above. The decompressed scan patterns are chosen to test manufacturing faults, including stuck-at faults, transition faults, path-delay faults, IDDQ (IDD quiescent current) faults, and bridging faults, in said scan-based integrated circuit.

The scan connector 205 is optional. It is often used when it is required to (1) improve the fault coverage of the scan core 250 and (2) allow easy silicon debug and diagnosis. Since the pipelined decompressor 202 imposes input constraints on the scan core 250, the fault coverage of the scan core 250 with the pipelined decompressor is typically slightly lower than that without the pipelined decompressor. The scan connector can uncover the fault coverage loss. At least one virtual scan input 206 is required for the reconfiguration of the scan chains, SCH1 260 through SCHL 262, to either split one long scan chain to two or more short scan chains or merge two or more short scan chains into one long scan chain. The scan connector 205 typically comprises a multiplexer network that is controlled by one or more virtual scan inputs and is loaded with a predetermined state before a test session starts. In order to reduce or eliminate the inter-dependency of the scan chains, SCH1 260 through SCHL 262, during ATPG to increase the fault coverage of the scan core 250, the scan connector may comprise additional multiplexers controlled by one or more said virtual scan inputs and spare scan cells in selected scan chains.

Because the shift registers differ from an LFSR in that they do not have a circular structure with feedback, the present state of the shift register can only influence a limited number of future states of the shift register. This property of the shift register greatly simplifies the constraints imposed by the decompressor. Unlike the conventional LFSR-based sequential decompressor, the constraints for each scan cell here depend only on a limited number of compressed scan pattern bits. This makes it feasible to incorporate the constraints into an ATPG program for generating the compressed scan pattern in one-step. It avoids the need for solving the set of linear equations in a two-step ATPG process.

The one-step ATPG incorporating the input constraints can be performed in one of three ways: (1) specifying the input-output relationship of the pipelined decompressor as a table of legal or illegal input combinations, (2) duplicating or expanding the pipelined decompressor into the database that represents the connectivity of the scan-based integrated circuit, or (3) simply using a sequential ATPG approach to incorporate said input constraints, for generating the compressed scan patterns.

Figure 3:
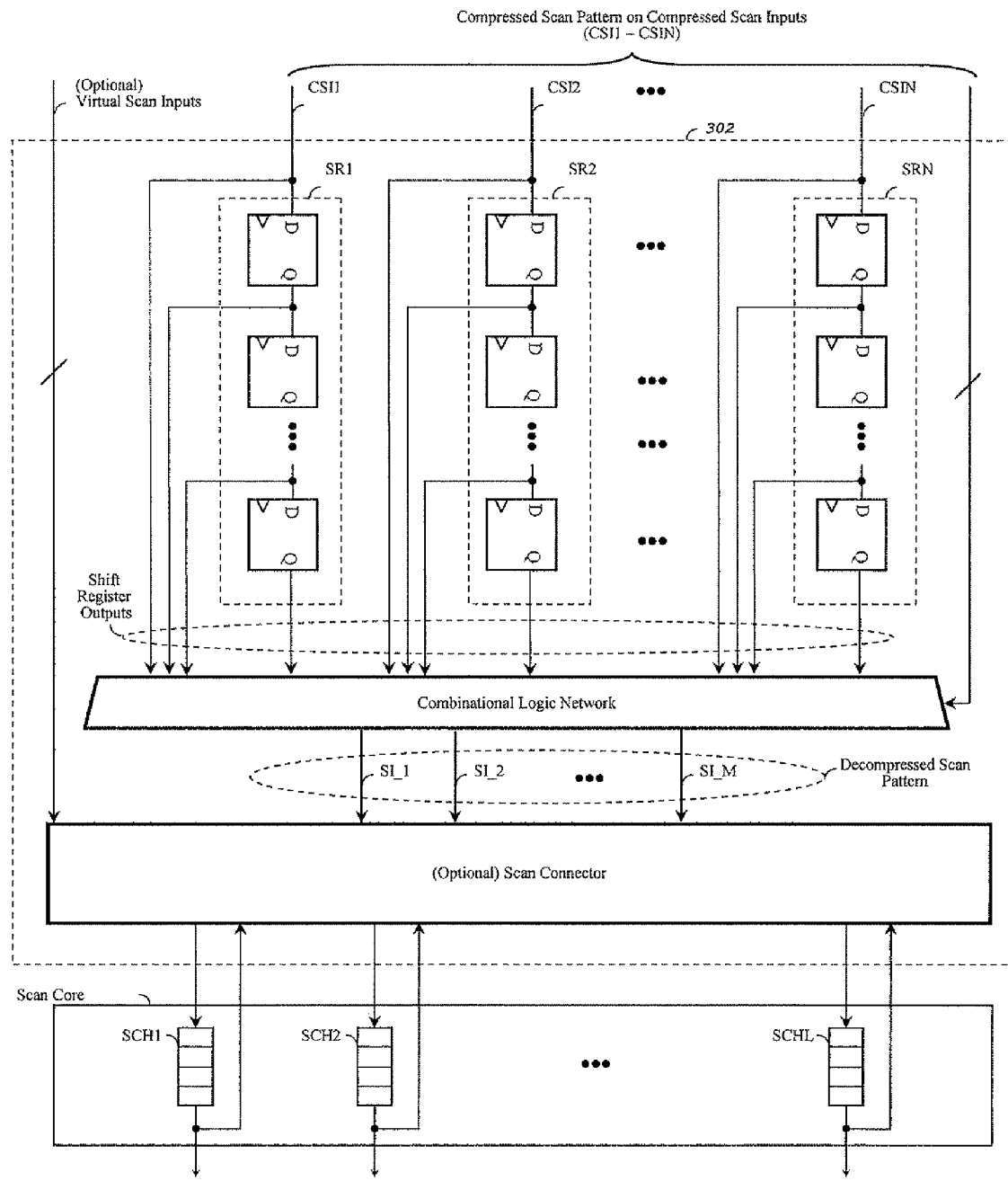
FIG. 3 shows a second prior art block diagram of a pipelined decompressor for testing a scan core.

FIG. 3 shows a second prior art block diagram of a pipelined decompressor 302. The design and operation is identical to the one described in FIG. 2 with the exception of additional inputs to the combinational logic network which come from the shift register outputs. Instead of only using the output of the last stage of the shift register to drive the combinational logic network, the outputs of the intermediate stages of the shift register (SR1, SR2, ..., SRN) are used as well. This allows the combinational logic network to be designed to provide greater encoding flexibility.

Figure 4:
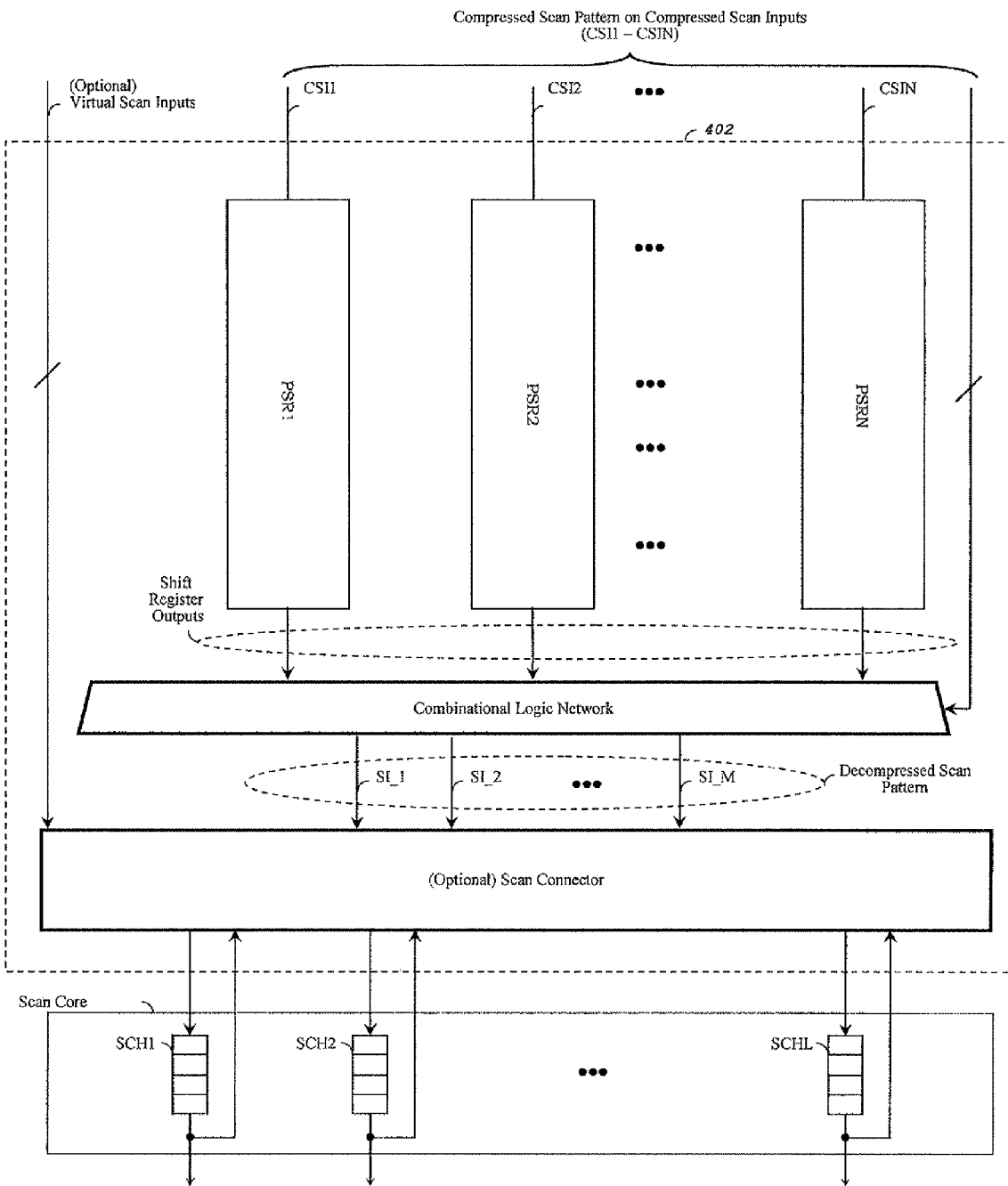
FIG. 4 shows a block diagram of a programmable pipelined decompressor, in accordance with the present invention, for testing a scan core.

FIG. 4 show a block diagram of a programmable pipelined decompressor 402, in accordance with the present invention, for testing a scan core. The design and operation is identical to the one described in FIG. 2 with the exception of the shift registers. The present invention replaces the standard shift registers in FIG. 2 with programmable shift registers (PSR1, PSR2, ..., PSRN). The design and operation of the programmable shift registers are described in subsequent figures, i.e., FIGS. 5-12.

Figure 5:
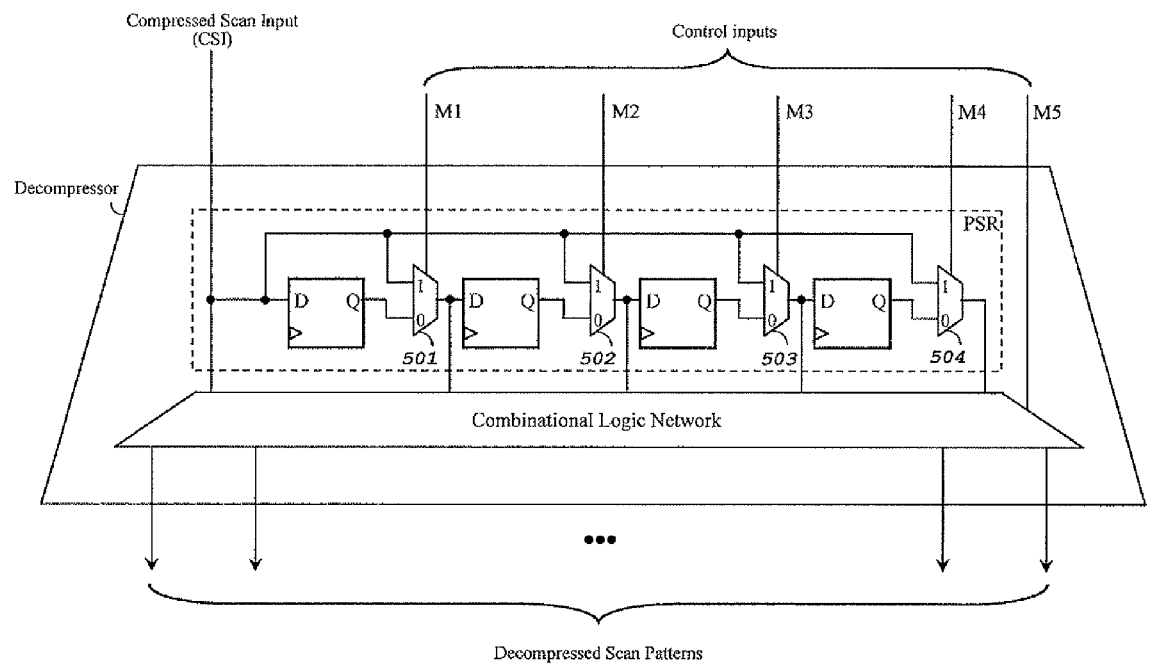
FIG. 5 shows a first embodiment of a 4-stage programmable pipelined decompressor, in accordance with the present invention, for testing a scan core.

FIG. 5 shows a first embodiment of a 4-stage programmable pipelined decompressor, in accordance with the present invention. It consists of a programmable shift register (PSR) with one or more D flip-flops (or latches) and one or more multiplexers. The input of the programmable shift register is connected to a compressed scan input (CSI) coming from an ATE; each output of the D flip-flops (or latches) and CSI may drive the combinational logic network. MUXs 501-504 are placed between each stage of the shift register and are controlled by mode inputs M1-M4. The mode input selects whether the MUX's output comes from the output of the previous stage of the shift register, or whether it comes from the CSI. By setting the mode bits appropriately, it is possible subdivide the original PSR into a set of two or more shorter shift registers. Hence, the mode bits make it possible to program the shift registers to be a certain desired length when performing test vector decompression (i.e., a depth-d pipeline shift register). Note that one mode signal, M5, directly feeds the combinational logic network. This mode signal can be used to control the behavior of the combinational logic. Examples of this will be shown in subsequent figures.

Figure 6:
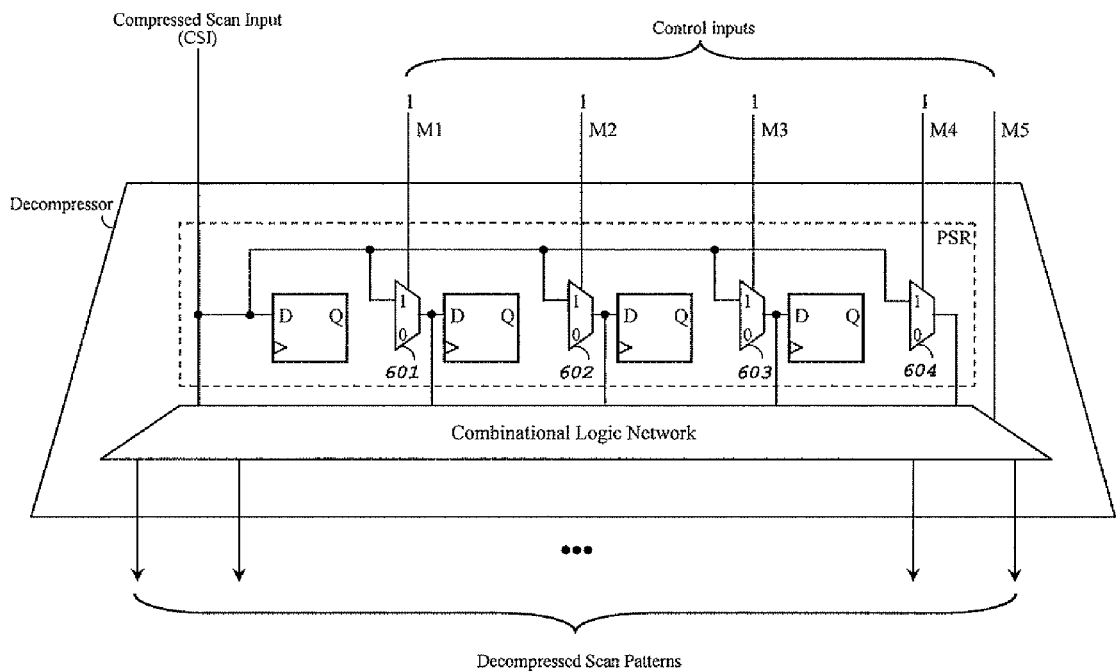
FIG. 6 shows a first configuration of the 4-stage programmable pipelined decompressor shown in FIG. 5, as a depth-0 shift register, in accordance with the present invention.

FIG. 6 shows a first configuration of the 4-stage programmable pipelined decompressor shown in FIG. 5 as a depth-0 shift register, in accordance with the present invention. In this configuration, the shift register is bypassed, and CSI is used to drive the combinational network. Note that this mode of operation is similar to an Illinois scan circuit, as described in Hamzaoglu and Patel (1999), where a single input is fanned out to drive multiple scan chains. All the mode signals (M1-M4) are set to 1, this causes the MUXs 601-604 to drive their outputs with CSI. The decompression is fully combinational as each clock cycle; a new bit comes in through CSI and drives all the inputs of the combinational logic network. No data from previous clock cycles is used. Hence, the sequential depth is 0 in this configuration.

Figure 7:
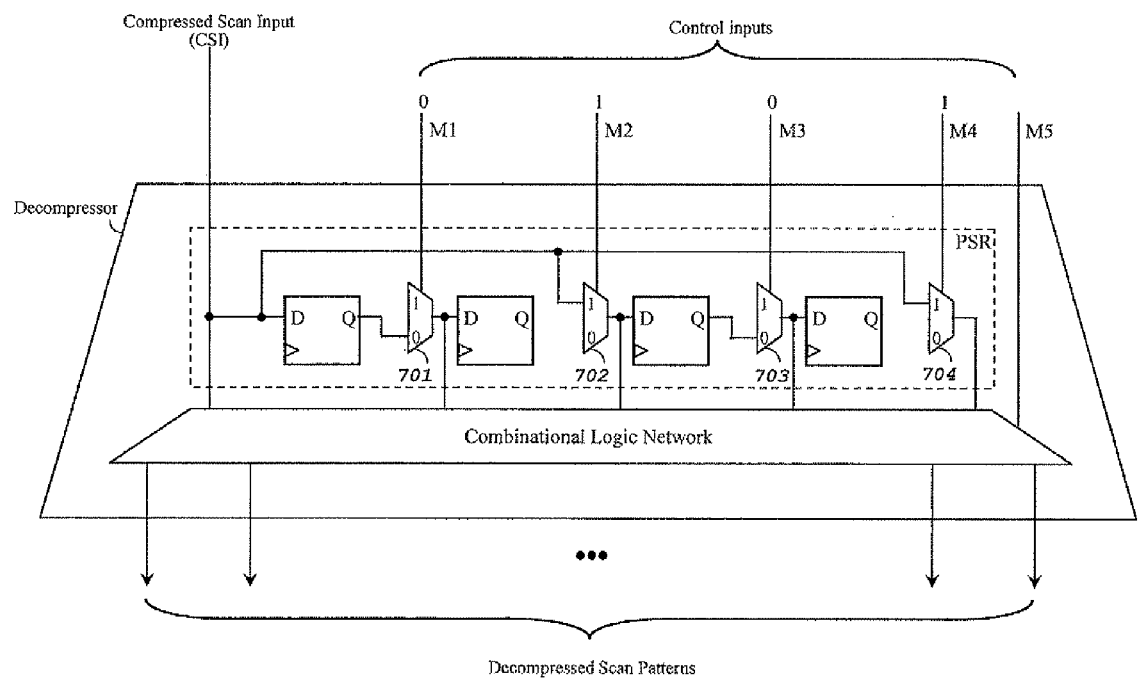
FIG. 7 shows a second configuration of the 4-stage programmable pipelined decompressor, shown in FIG. 5, as a depth-1 shift register, in accordance with the present invention.

FIG. 7 shows a second configuration of the 4-stage programmable pipelined decompressor, shown in FIG. 5, as a depth-1 shift register, in accordance with the present invention. In this configuration, the mode signals M1 and M3 are set to 0, and M2 and M4 are set to 1. This causes the output of MUX 701 and 703 to be driven by a shift registers whose depth is 1. The output of MUX 702 and 704 are driven by CSI. The decompression depends both on the data coming through CSI in the present clock cycle as well the data from the previous clock cycle which is stored in the depth-1 shift registers driving MUX 701 and 703.

Figure 8:
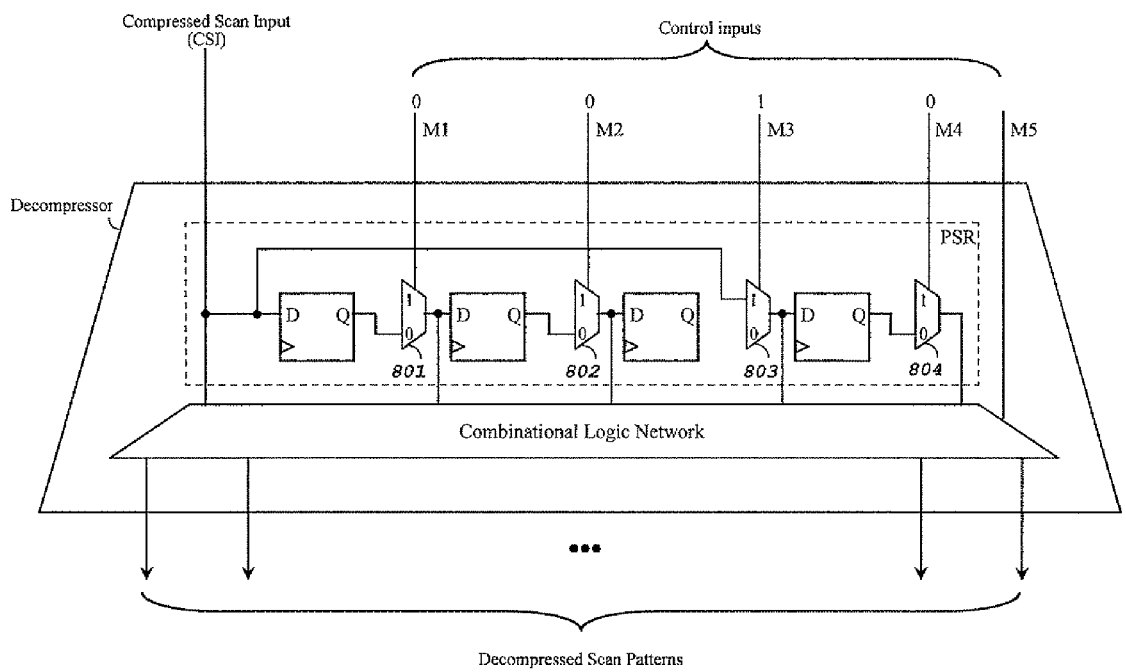
FIG. 8 shows a third configuration of the 4-stage programmable pipelined decompressor shown in FIG. 5 as a depth-2 shift register, in accordance with the present invention.

FIG. 8 shows a third configuration of the 4-stage programmable pipelined decompressor, shown in FIG. 5, as a depth-2 shift register, in accordance with the present invention. In this configuration, the mode signals M1, M2, and M4 are set to 0, and M3 is set to 1. This causes the output of MUX 801 and 804 to be driven by a shift registers whose depth is 1, and the output of MUX 803 to be driven by a shift register whose depth is 2. The decompression depends on data coming through CSI in the present clock cycle, as well the data from the previous clock cycle which is stored in the depth-1 shift registers driving MUX 801 and 804, and it also depends on data from 2 clock cycles earlier which is stored in the depth-2 shift register driving MUX 803.

Figure 9:
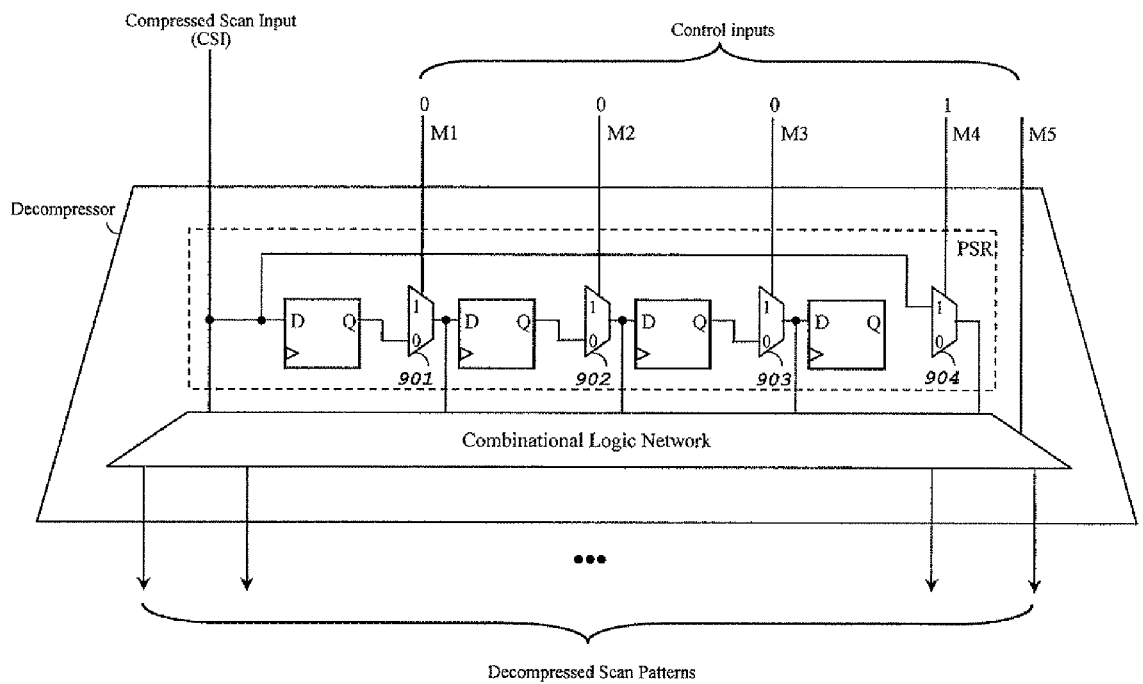
FIG. 9 shows a fourth configuration of the 4-stage programmable pipelined decompressor shown in FIG. 5 as a depth-3 shift register, in accordance with the present invention.

FIG. 9 shows a fourth configuration of the 4-stage programmable pipelined decompressor shown in FIG. 5 as a depth-3 shift register, in accordance with the present invention. In this configuration, the mode signals M1, M2, and M3 are set to 0, and M4 is set to 1. This causes the output of MUX 904 to be driven by CSI, the output of MUX 901 to be driven by a shift register whose depth is 1, the output of MUX 902 to be driven by a shift register whose depth is 2, and the output of MUX 903 to be driven by a shift register of depth 3. The decompression depends on data coming through CSI in the present clock cycle, as well the data from the previous three clock cycles which are stored in the depth-1, depth-2, and depth-3 shift registers driving MUXs 901, 902, and 903, respectively.

Figure 10:
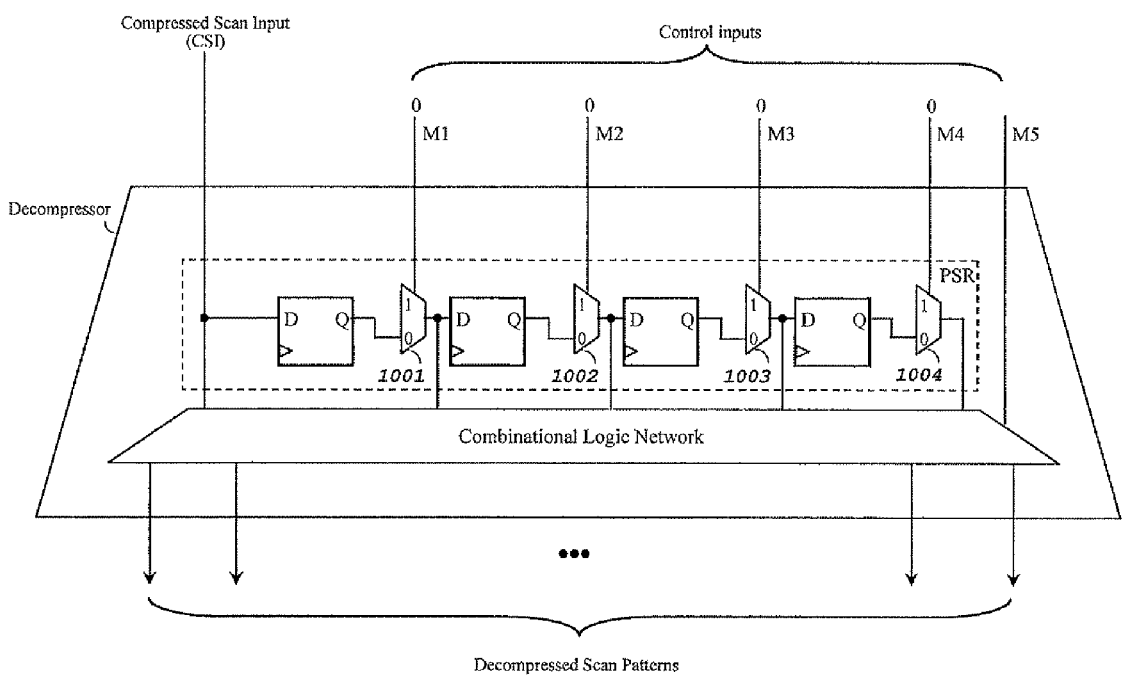
FIG. 10 shows a fifth configuration of the 4-stage programmable pipelined decompressor shown in FIG. 5 as a depth-4 shift register, in accordance with the present invention.

FIG. 10 shows a fourth configuration of the 4-stage programmable pipelined decompressor shown in FIG. 5 as a depth-4 shift register, in accordance with the present invention. In this configuration, all mode signals M1-M4 are set to 0. This causes the output of MUX 1001 to be driven by a shift register whose depth is 1, the output of MUX 1002 to be driven by a shift register whose depth is 2, the output of MUX 1003 to be driven by a shift register of depth 3, and the output of MUX 1004 to be driven by a shift register of depth 4. The decompression depends on data coming through CSI in the present clock cycle, as well the data from the previous four clock cycles which are stored in the depth-1, depth-2, depth-3, and depth-4 shift registers driving MUXs 901, 902, 903, and 904, respectively.

Figure 11:
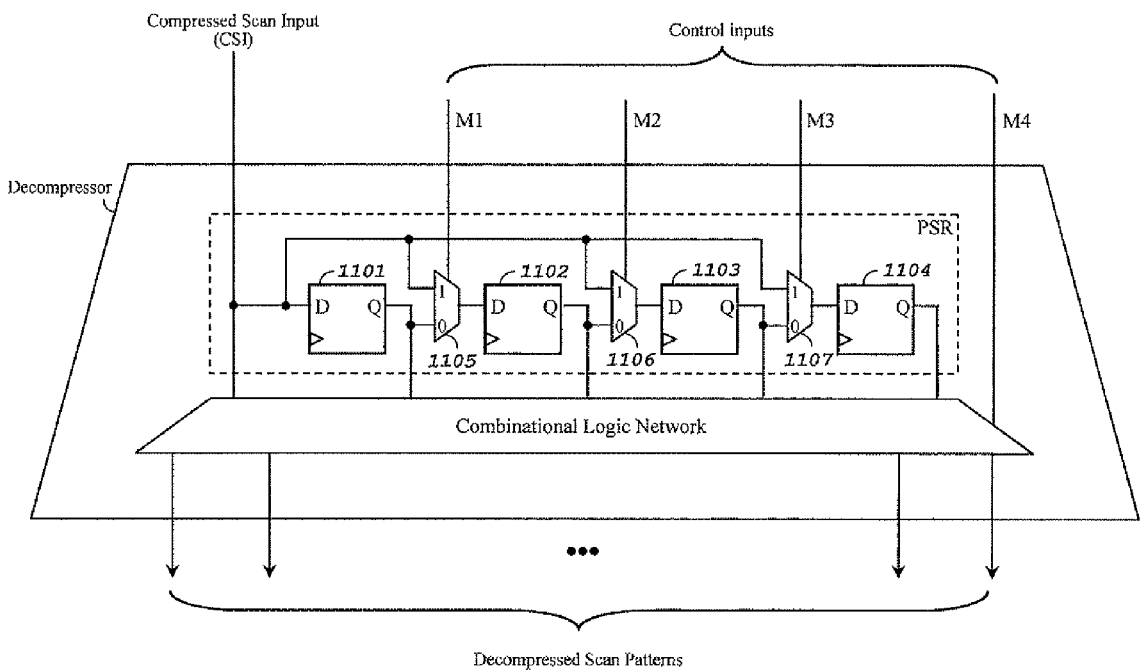
FIG. 11 shows a second embodiment of a 4-stage programmable pipelined decompressor, in accordance with the present invention, for testing a scan core.

FIG. 11 shows a second embodiment of a 4-stage programmable pipelined decompressor, in accordance with the present invention. It consists of a programmable shift register (PSR) with one or more D flip-flops (or latches) and one or more multiplexers. The input of the programmable shift register PSR may be connected to a compressed scan input (CSI) coming from an ATE; each output of the D flip-flops (or latches) and CSI may drive the combinational logic network. MUXs 1105-1107 are placed between each stage of the shift register and are controlled by mode inputs M1-M3. The mode input selects whether the MUX's output comes from the output of the previous stage of the shift register, or whether it comes from the CSI. By setting the mode bits appropriately, it is possible subdivide the original PSR into a set of two or more shorter shift registers. Hence, the mode bits make it possible to program the shift registers to be a certain desired length when performing test vector decompression (i.e., a depth-d pipeline shift register). Note that one mode signal, M4, directly feeds the combinational logic network. This mode signal can be used to control the behavior of the combinational logic network. Examples of this will be shown in subsequent figures. The difference between the embodiment in FIG. 11 and the one shown in FIG. 5 is that in that in FIG. 11 the inputs to the combinational logic network come directly from the output of the flip-flops 1101-1104, whereas in FIG. 5 the inputs to the combinational logic network came from the outputs of the MUXs. The advantage of the embodiment in FIG. 11 is that it only requires 3 MUXs and 3 mode signals to control the MUXs. The drawback is that it does not provide a depth-0 configuration.

Figure 12:
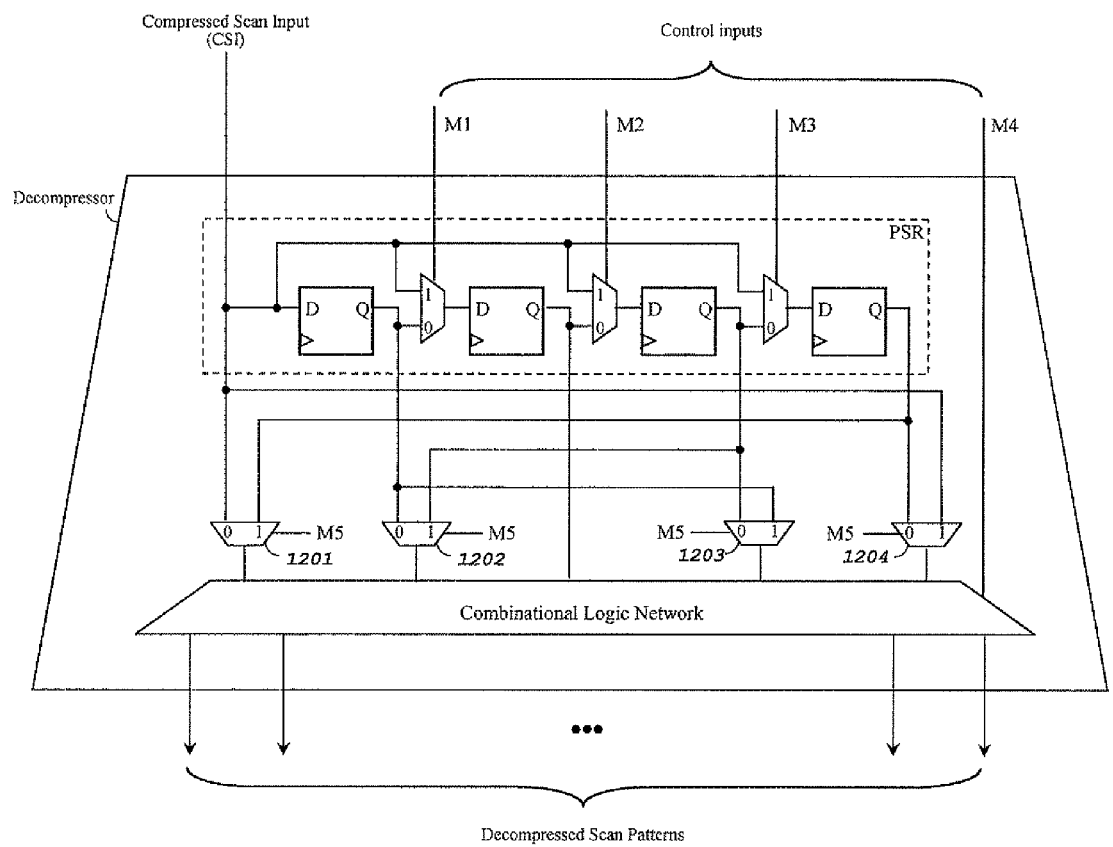
FIG. 12 shows a first embodiment of adding a forward/backward shift mode to the 4-stage programmable pipelined decompressor shown in FIG. 11, in accordance with the present invention, for testing a scan core.

FIG. 12 shows a first embodiment of adding a forward/backward shift mode to the 4-stage programmable pipelined decompressor shown in FIG. 11, in accordance with the present invention. MUXs 1201-1204 are added between the PSR and the combinational logic network. A mode signal M5 is used to select which signal the MUXs connect to the combinational logic network. When M5 is 0, then the MUXs connect the outputs of the shift register to the combinational logic in their normal forward order. However, when M5 is 1, then the MUXs connect the output of the shift register to the combinational logic in the reverse order. The input to the shift register, i.e., CSI, drives the output of MUX 1201 in forward order, while the output of the last stage of the shift register drives the output of MUX 1201 in reverse order. The output of the first stage of the shift register drives the output of MUX 1202 in forward order, while the output of the third stage of the shift register drives the output of MUX 1202 in reverse order. The output of the third stage of the shift register drives the output of MUX 1203 in forward order, while the output of the first stage of the shift register drives the output of MUX 1203 in reverse order. The output of the last stage of the shift register drives the output of MUX 1204 in forward order, while the input to the shift register drives the output of MUX 1204 in reverse order. The ability to reverse the order of the inputs to the combinational logic network provides an additional degree of freedom when encoding test vectors and hence increases the encoding flexibility of the decompressor.

Figure 13:
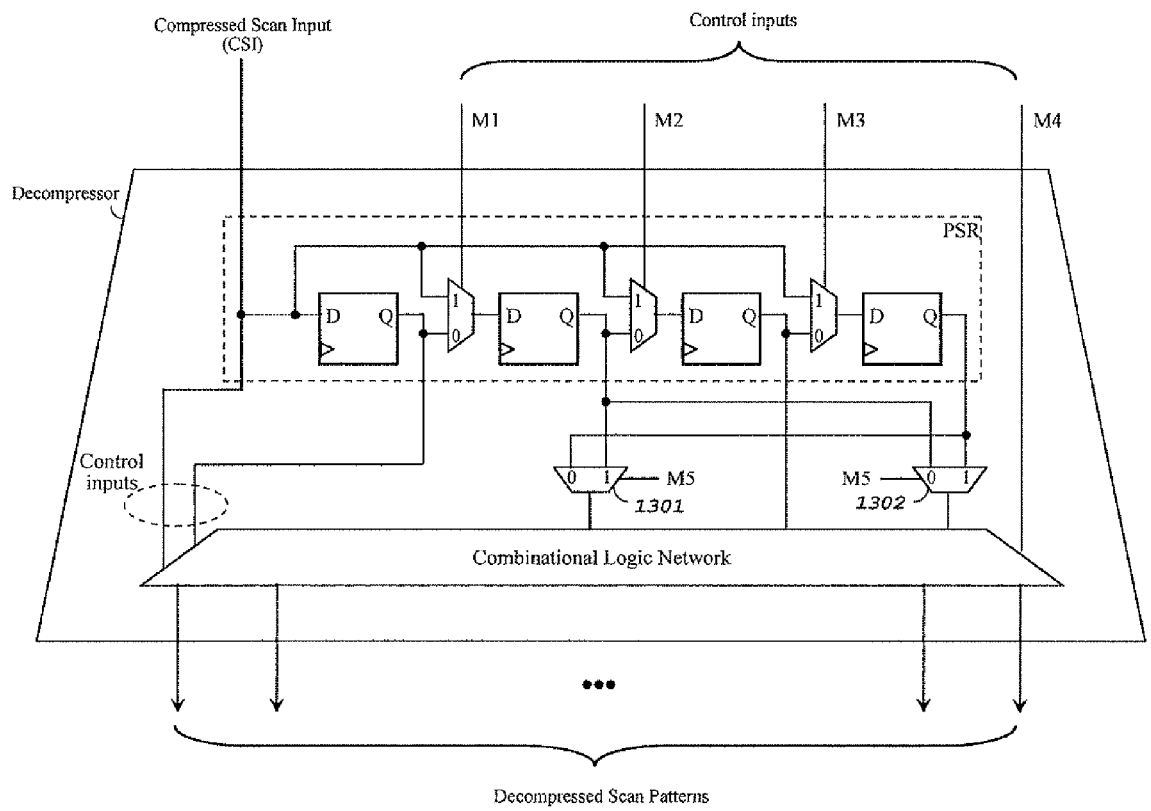
FIG. 13 shows a second embodiment of adding a forward/backward shift mode to the 4-stage programmable pipelined decompressor shown in FIG. 11, in accordance with the present invention, for testing a scan core.

FIG. 13 shows a second embodiment of adding a forward/backward shift mode to the 4-stage programmable pipelined decompressor shown in FIG. 11, in accordance with the present invention. Two control inputs are provided to the combinational logic network which may be helpful for reconfiguring the combinational logic network to further increase the encoding flexibility of the decompressor. One comes from the CSI and the other from the output of the first stage of the shift register. MUXs 1301 and 1302 are added between the PSR and the combinational logic network. A mode signal M5 is used to select which signal the MUXs connect to the combinational logic. When M5 is 0, then the MUXs connect the outputs of the shift register to the combinational logic in their normal forward order. However, when M5 is 1, then the MUXs connect the output of the shift register to the combinational logic in the reverse order. The output of the second stage of the shift register drives the output of MUX 1301 in forward order, while the output of the fourth stage of the shift register drives the output of MUX 1301 in reverse order. The output of the fourth stage of the shift register drives the output of MUX 1302 in forward order, while the output of the second stage of the shift register drives the output of MUX 1302 in reverse order. The ability to reverse the order of the inputs to the combinational logic network provides an additional degree of freedom when encoding test vectors and hence increases the encoding flexibility of the decompressor.

Figure 14:
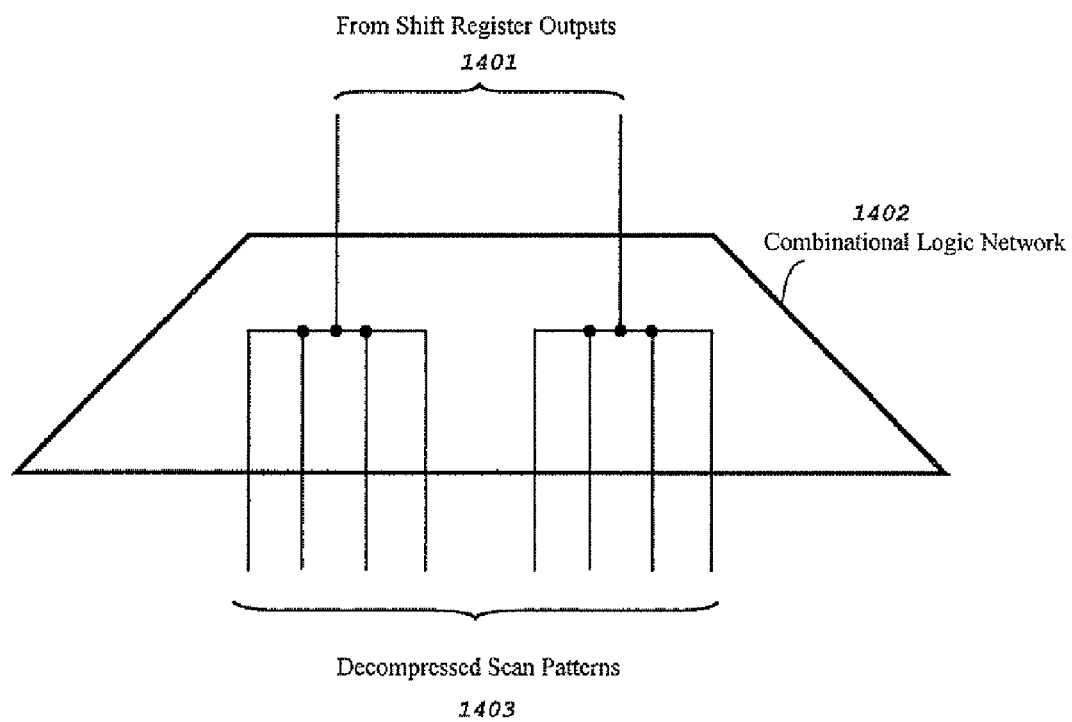
FIG. 14 shows a first embodiment of a combinational logic network using buffers, in accordance with the present invention, for testing a scan core.

FIG. 14 shows a first embodiment of a combinational logic network using buffers, in accordance with the present invention. The inputs 1401 to the combinational logic network 1402 are fanned out to generate the decompressed scan patterns at the output 1403 of the combinational logic network 1402. In this manner, a smaller number of inputs 1401 to the combinational logic network 1402 can drive a larger number of scan chains at the outputs 1403.

Figure 15:
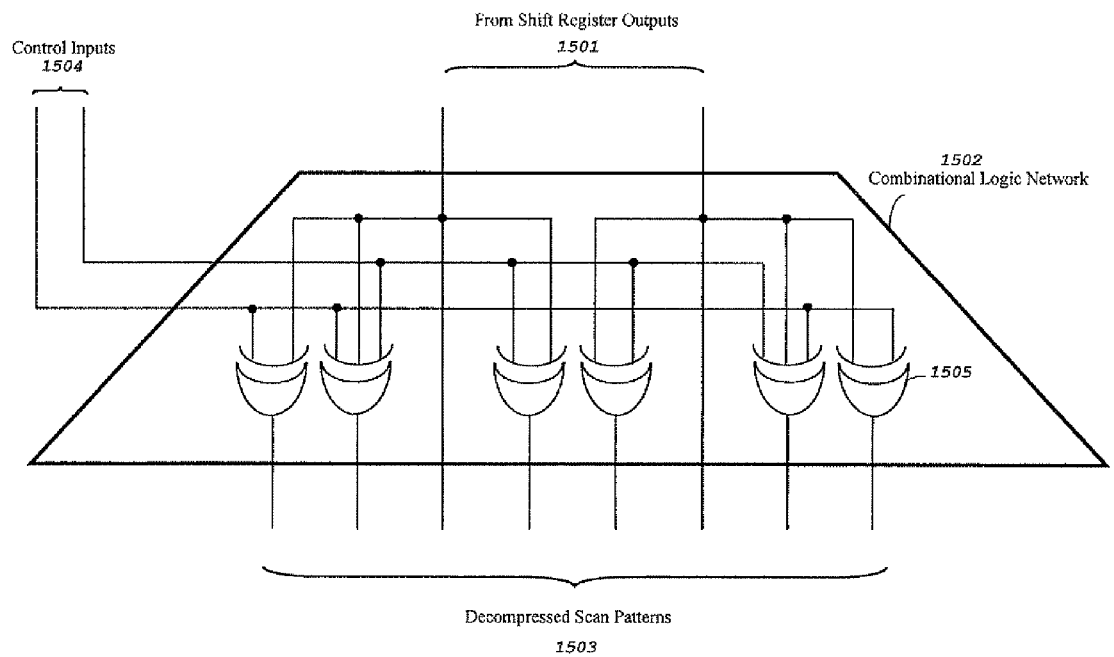
FIG. 15 shows a second embodiment of a combinational logic network using XOR gates, in accordance with the present invention, for testing a scan core.

FIG. 15 shows a second embodiment of a combinational logic network using XOR gates, in accordance with the present invention. There may be two types of inputs to the combinational logic network 1502. One is the control inputs 1504 and the other is the data inputs from the shift register outputs 1501. The control inputs may be optional. Both of these inputs are used to drive XOR gates 1505 whose outputs produce the decompressed scan patterns 1503 at the output of the combinational logic network 1502. The control inputs 1504 can be used to make the XOR gates either invert or not invert the data inputs 1501 when generating the decompressed scan patterns 1503. By changing the control inputs, it is possible to change which set of XOR gates will invert during decompression and thereby creating additional encoding flexibility.

Figure 16:
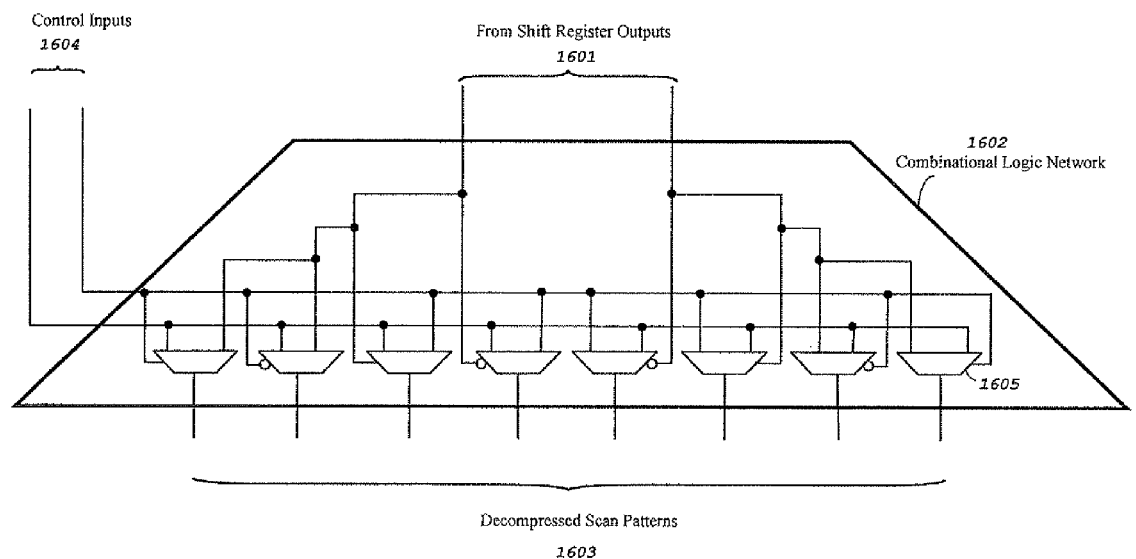
FIG. 16 shows a first embodiment of a combinational logic network using MUX gates, in accordance with the present invention, for testing a scan core.

FIG. 16 shows a first embodiment of a combinational logic network using MUX gates, in accordance with the present invention. The inputs to the combinational logic network 1602 include both control inputs 1604 as well as data inputs coming from the shift register outputs 1601. These inputs are used to drive MUXs 1605 whose outputs produce the decompressed scan patterns 1603 at the output of the combinational logic network 1602. There are several degrees of freedom in how the control inputs are connected to the MUXs 1605. They can drive the select input to the MUX either inverted or non-inverted, and they can drive either of the data inputs to the MUXs. This degree of freedom can be used to reduce correlation in the behavior of the MUXs which helps to improve encoding flexibility for the decompressor.

Figure 17:
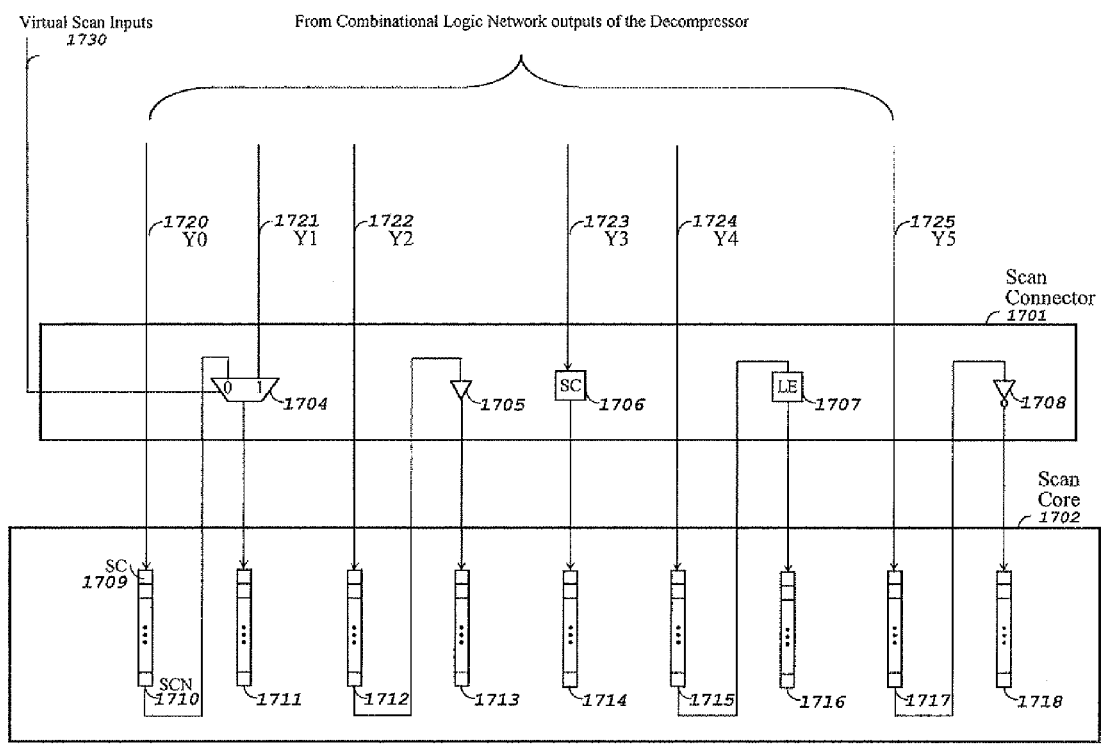
FIG. 17 shows an embodiment of a scan connector, in accordance with the present invention, for testing a scan core.

FIG. 17 shows an embodiment of an optional scan connector, in accordance with the present invention. The inputs to the scan connector, Y0 1720 through Y5 1725, come from the outputs of the combinational logic block shown in FIG. 5, and the outputs of the scan connector are used to drive the scan data inputs SC 1709 of the scan core 1702. The scan connector 1701 can contain any combination of multiplexers 1704, buffers 1705, spare scan cells SC 1706, lockup elements LE 1707, or inverters 1708. The multiplexers can be controlled by one of more virtual scan inputs 1730 and can be used to selectively merge two or more short scan chains into one long scan chain by connecting the last scan cell SCN of one scan chain of 1710 through 1718 to another scan chain, and vice versa. The buffers and inverters can be used to buffer long interconnects between scan chains. The spare scan cells can be used to reduce or eliminate inter-dependencies between scan chains. The lockup latches, which are typically storage elements such as flip-flops or latches, can be used to avoid clock skew problems at clock domain boundaries.

Figure 18:
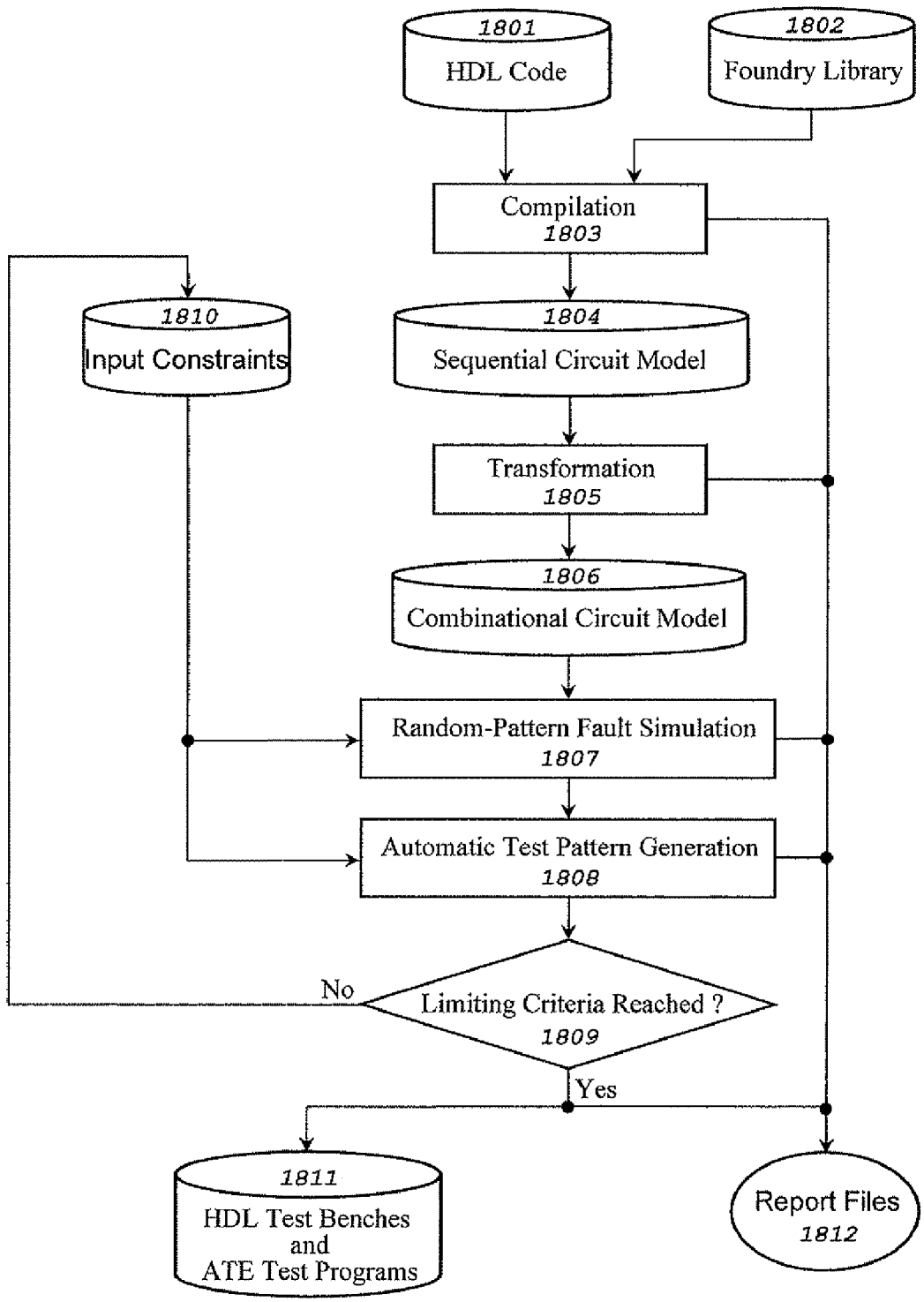
FIG. 18 shows a block diagram of the method for generating compressed scan patterns used for testing a scan core, in accordance with the present invention.

FIG. 18 shows a flow chart of the method for generating compressed scan patterns used for testing a scan core, in accordance with the present invention. This method 1800 accepts the user-supplied hardware description language (HDL) code 1801 together with the chosen foundry library 1802. The HDL code represents a sequential circuit comprised of a programmable pipeline decompressor, a scan core, and a compactor as shown in FIG. 1. The HDL code and the library are then complied into an internal sequential circuit model 1804, which is then transformed into a combination circuit model 1806. Then, based on input constraints 1810, combinational fault simulation 1807 is performed, if so required, for a number of random patterns and all detected faults are removed from the fault list. After that, combinational ATPG 1808 is performed to generate compressed scan patterns and all detected faults are removed from the fault list. If predetermined limiting criteria, such as a pre-selected fault coverage goal, are met, the HDL testbenches and ATE test programs 1811 are generated while all reports and errors are saved in the report files 1812. If the predetermined limiting criteria are not met, new input constraints 1810 will be used. For example, a new set of control input values and virtual scan input values may be loaded into the programmable shift registers, the combinational logic network, or the scan connector to specify new input constraints. After that, optional random-pattern fault simulation 1807 and ATPG 1808 are performed. This iteration goes on until the predetermined limiting criteria are met.

Figure 19:
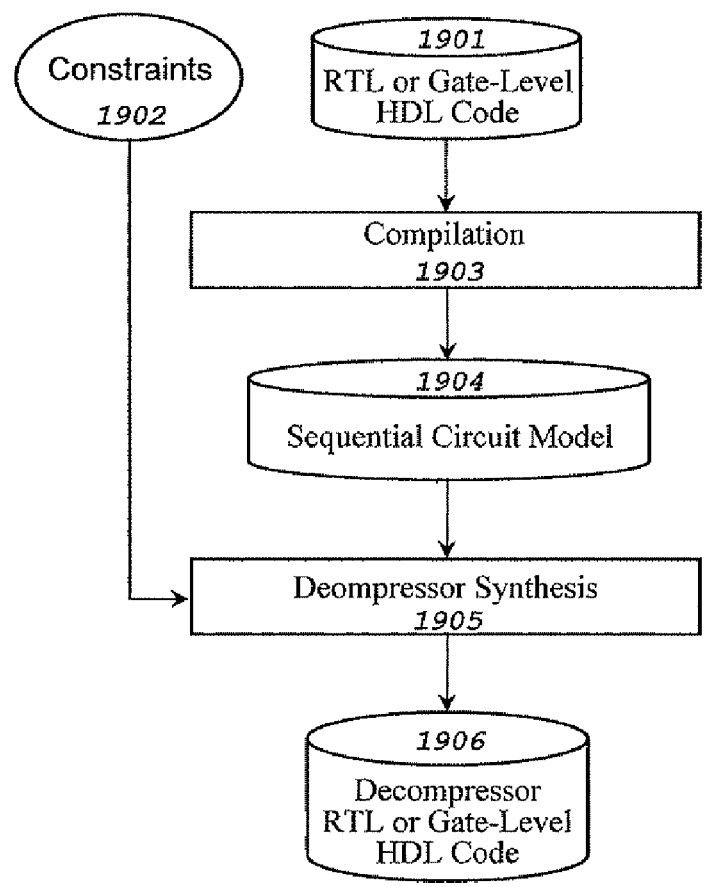
FIG. 19 shows a block diagram of a method for synthesizing a programmable pipelined decompressor at a register-transfer level (RTL) or a gate level, in accordance with the present invention.

FIG. 19 shows a block diagram of a method for synthesizing a compressor at a register-transfer level (RTL) or a gate-level, in accordance with the present invention. In this flow diagram, RTL or Gate-Level HDL Code 1901 goes through Compilation 1903 to generate Sequential Circuit Model 1904. Next, Decompressor Synthesis 1905 is performed according to Sequential Circuit Model 1904 and Constraints 1902 to generate Decompressor RTL or Gate-Level HDL Code 1906. The Decompressor RTL or Gate-Level HDL Code 1906 is generated as a combinational logic network comprising any combination of logic gates, such as AND gates, OR gates, NAND gates, NOR gates, XOR gates, XNOR gates, multiplexers, buffers, and inverters.

Having thus described presently preferred embodiments of the present invention, it can now be appreciated that the objectives of the invention have been fully achieved. And it will be understood by those skilled in the art that many changes in construction & circuitry, and widely differing embodiments & applications of the invention will suggest themselves without departing from the spirit and scope of the present invention. The disclosures and the description herein are intended to be illustrative and are not in any sense limitation of the invention, more preferably defined in scope by the following claims.

What is claimed is:

1. A method that accepts a compressed scan pattern stored in an ATE (automatic test equipment) for generating a decompressed scan pattern in a decompressor for testing a scan-based integrated circuit, said decompressor accepting the compressed scan patterns via compressed scan inputs for generating the decompressed scan patterns, the scan-based integrated circuit containing multiple scan chains, each scan chain comprising multiple scan cells coupled in series, the scan chains coupled to the decompressor, the decompressor comprising one or more programmable shift registers connected to said compressed scan inputs and a combinational logic network connected to said compressed scan inputs and said shift register outputs for connecting the outputs of said combinational logic network to selected scan inputs of all said scan chains, said method comprising:
   a) placing said decompressor between said ATE and said scan-based integrated circuit;
   b) transmitting said compressed scan pattern stored in said ATE to said decompressor for generating said decompressed scan pattern to test manufacturing faults in said scan-based integrated circuit; and
   c) comparing a test response of said scan-based integrated circuit with an expected test response.

2. The method of claim 1, further including a first scan connector for connecting the outputs of said combinational logic network and selected scan outputs of all said scan chains to selected scan inputs of all said scan chains; wherein said first scan connector further comprises a multiplexer network controlled by one or more virtual scan inputs.

3. The method of claim 1, wherein said decompressor further including using a plurality of second scan connectors to connect the outputs of said combinational logic network to selected scan chain inputs in said scan-based integrated circuit, wherein said plurality of second scan connectors include one or more buffers, inverters, lockup elements each comprising a storage element such as flip-flop or latch, spare scan cells, first multiplexers, or any combination of the above.

4. The method of claim 1, wherein said first scan connector further including using a third scan connector for splitting a selected scan chain to two or more short scan chains or merge a plurality of selected scan chains into one long scan chain, wherein said third scan connector further comprises one or more second multiplexers and wherein said second multiplexers are controlled by one or more said virtual scan inputs.

5. The method of claim 1, wherein said programmable shift register selectively comprises one or more flip-flops or latches and one or more third multiplexers; where in said flip-flops or latches are selected scan cells in said scan-based integrated circuit, spare flip-flops or latches, or a combination of both, which are connected in series to form said programmable shift registers.

6. The method of claim 1, wherein said combinational logic network further includes one or more combinational logic gates, selected from AND gates, OR gates, NAND gates, NOR gates, fourth multiplexers, XOR gates, XNOR gates, buffers, inverters, or a combination of the above.

7. The method of claim 1, wherein said combinational logic network includes using one or more control inputs to selectively invert or not invert select inputs and/or outputs of said combinational logic network, control the shifting of said one or more programmable shift registers selectively in a forward, backward, or a predetermined direction, or perform said invert and shifting operations together.

8. The method of claim 1, further including means for transmitting said compressed scan patterns to said compressed scan inputs and said virtual scan inputs of said decompressor and transmitting said compressed scan patterns generated by said decompressor to selected scan inputs of said scan chains in said scan-based integrated circuit.

9. The method of claim 1, wherein said decompressor is selectively placed within said scan-based integrated circuit or inside said ATE.

10. The method of claim 1, wherein said decompressed scan patterns are chosen to test said manufacturing faults, including stuck-at faults, transition faults, path-delay faults, IDDQ (IDD quiescent current) faults, and bridging faults, in said scan-based integrated circuit.

* * * * *